(12) United States Patent
Lee et al.

(10) Patent No.: US 12,322,720 B2
(45) Date of Patent: *Jun. 3, 2025

(54) SEMICONDUCTOR PACKAGE INCLUDING POST

(71) Applicant: SAMSUNG ELECTRONICS CO., LTD., Suwon-si (KR)

(72) Inventors: Jaekul Lee, Yongin-si (KR); Hyungsun Jang, Hwaseong-si (KR); Gayoung Kim, Hwaseong-si (KR); Minjeong Shin, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

This patent is subject to a terminal disclaimer.

(21) Appl. No.: 18/618,133

(22) Filed: Mar. 27, 2024

(65) Prior Publication Data

US 2024/0243090 A1    Jul. 18, 2024

Related U.S. Application Data

(63) Continuation of application No. 17/479,042, filed on Sep. 20, 2021, now Pat. No. 11,967,578.

(30) Foreign Application Priority Data

Jan. 29, 2021    (KR) ........................ 10-2021-0013152

(51) Int. Cl.
    *H01L 23/48*    (2006.01)
    *H01L 23/00*    (2006.01)
    *H01L 25/10*    (2006.01)

(52) U.S. Cl.
    CPC .............. *H01L 24/20* (2013.01); *H01L 24/73* (2013.01); *H01L 25/105* (2013.01);
(Continued)

(58) Field of Classification Search
    CPC ..... H01L 2224/2105; H01L 2224/0233; H01L 2224/023; H01L 2225/1041; H01L 2225/1058
(Continued)

(56) References Cited

U.S. PATENT DOCUMENTS 5,739,587 A    4/1998    Sato
6,323,542 B1   11/2001   Hashimoto
(Continued)

FOREIGN PATENT DOCUMENTS

JP    2009-027185    2/2009
JP    5310947    10/2013
(Continued)

*Primary Examiner* — Nitin Parekh
(74) *Attorney, Agent, or Firm* — MORGAN, LEWIS & BOCKIUS LLP (57) ABSTRACT

A semiconductor package includes a lower redistribution layer disposed on a lower surface of the semiconductor chip including an insulating layer, a redistribution pattern, a via, an under bump metal (UBM), and a post disposed on the redistribution pattern. The post vertically overlaps with the UBM. A mold layer is on the lower redistribution layer and surrounds the semiconductor chip. A connecting terminal is connected to the UBM. The UBM includes a first section contacting the redistribution pattern, and a second section contacting the insulating layer. The post has a ring shape having an inner surface and an outer surface when viewed in a top view. A maximum width of the inner surface is less than a maximum width of an upper surface of the first section. A maximum width of the outer surface is greater than the maximum width of the upper surface of the first section.

20 Claims, 9 Drawing Sheets

(52) U.S. Cl.
CPC ............... *H01L 2224/2101* (2013.01); *H01L 2224/2105* (2013.01); *H01L 2224/221* (2013.01); *H01L 2224/73101* (2013.01); *H01L 2225/1035* (2013.01); *H01L 2225/1041* (2013.01); *H01L 2225/1058* (2013.01)

(58) Field of Classification Search
USPC ........................................................ 257/737
See application file for complete search history.

(56) References Cited

U.S. PATENT DOCUMENTS

| | | | |
|---|---|---|---|
| 6,483,191 | B2 | 11/2002 | Umezaki |
| 7,514,335 | B2 | 4/2009 | Wakabayashi et al. |
| 7,638,418 | B2 | 12/2009 | Bauer et al. |
| 7,977,789 | B2 | 7/2011 | Park |
| 8,084,871 | B2 | 12/2011 | Rahim et al. |
| 8,198,133 | B2 | 6/2012 | Daubenspeck et al. |
| 11,462,487 | B2 | 10/2022 | Heo |
| 11,676,948 | B2 | 6/2023 | Ng et al. |
| 11,694,984 | B2 | 7/2023 | Lu |
| 2002/0027269 | A1 | 3/2002 | Hashimoto |
| 2003/0089969 | A1 | 5/2003 | Hashimoto |
| 2007/0020906 | A1 | 1/2007 | Chiu et al. |
| 2007/0187825 | A1 | 8/2007 | Hashimoto |
| 2008/0079162 | A1 | 4/2008 | Hashimoto |
| 2009/0096094 | A1 | 4/2009 | Tetani et al. |
| 2009/0111260 | A1 | 4/2009 | Hashimoto |
| 2009/0283903 | A1 | 11/2009 | Park |
| 2010/0240176 | A1 | 9/2010 | Hashimoto |
| 2011/0095415 | A1 | 4/2011 | Topacio et al. |
| 2011/0095422 | A1 | 4/2011 | Hashimoto |
| 2011/0108981 | A1 | 5/2011 | Rahim et al. |
| 2012/0018882 | A1 | 1/2012 | Shim et al. |
| 2012/0270388 | A1 | 10/2012 | Topacio et al. |
| 2013/0099353 | A1 | 4/2013 | Kato et al. |
| 2014/0103527 | A1 | 4/2014 | Marimuthu |
| 2014/0110837 | A1 | 4/2014 | Topacio et al. |
| 2015/0001708 | A1 | 1/2015 | Lin et al. |
| 2015/0001709 | A1 | 1/2015 | Bao et al. |
| 2017/0098628 | A1* | 4/2017 | Liu ................. H01L 23/3142 |
| 2018/0158777 | A1* | 6/2018 | Chen ................. H01L 24/20 |
| 2021/0057366 | A1 | 2/2021 | Chang |
| 2021/0098434 | A1* | 4/2021 | Cheng ............. H01L 23/5389 |
| 2022/0246568 | A1 | 8/2022 | Lee et al. |

FOREIGN PATENT DOCUMENTS

| | | |
|---|---|---|
| KR | 10-0804392 | 2/2008 |
| KR | 10-1651617 | 8/2016 |
| KR | 10-2012-0093966 | 5/2020 |

* cited by examiner

SEMICONDUCTOR PACKAGE INCLUDING POST

CROSS-REFERENCE TO THE RELATED APPLICATIONS

This application is a continuation of U.S. patent application Ser. No. 17/479,042 filed on Sep. 20, 2021, which claims priority under 35 U.S.C. § 119 to Korean Patent Application No. 10-2021-0013152, filed on Jan. 29, 2021 in the Korean Intellectual Property Office, the disclosures of which are incorporated by reference in their entireties herein.

1. TECHNICAL FIELD

Embodiments of the present inventive concepts relate to a semiconductor package including a post.

2. DISCUSSION OF RELATED ART

As electronic products have become increasingly miniaturized and have a relatively light weight, the integration level of a semiconductor device applied to the electronic products has increased. The development direction of semiconductor packages may vary to provide a high integration level. A wafer level package and a panel level package may be provided in a semiconductor package for a miniaturized electronic product.

SUMMARY

Embodiments of the present inventive concepts provide a semiconductor package having an increased in board-level reliability.

According to an embodiment of the present inventive concepts, a semiconductor package includes a semiconductor chip. A lower redistribution layer is on a lower surface of the semiconductor chip. The lower redistribution layer comprises an insulating layer, a redistribution pattern on the insulating layer, a via connected to an upper surface of the redistribution pattern and extending through the insulating layer in a vertical direction, an under bump metal (UBM) disposed on a lower surface of the redistribution pattern, and a post disposed on the upper surface of the redistribution pattern, the post vertically overlaps with the UBM. A mold layer is on the lower redistribution layer. The mold layer surrounds a lateral side surface of the semiconductor chip. A connecting terminal is connected to the UBM. The UBM includes a first section having an upper surface directly contacting the redistribution pattern, and a second section having an upper surface directly contacting the insulating layer. The post has a ring shape having an inner surface and an outer surface when viewed in a top view. When viewed in a top view, a maximum width of the inner surface is less than a maximum width of an upper surface of the first section, and a maximum width of the outer surface is greater than the maximum width of the upper surface of the first section.

According to an embodiment of the present inventive concepts, a semiconductor package includes a semiconductor chip. A lower redistribution layer is on a lower surface of the semiconductor chip. The lower redistribution layer comprises an insulating layer, a redistribution pattern on the insulating layer, a via connected to an upper surface of the redistribution pattern and extending through the insulating layer in a vertical direction, an under bump metal (UBM) on a lower surface of the redistribution pattern, and a post between the redistribution pattern and the UBM. A mold layer is on the lower redistribution layer. The mold layer surrounds a lateral side surface of the semiconductor chip. A connecting terminal is connected to the UBM. The UBM comprises a first section having an upper surface directly contacting the post and a second section having an upper surface directly contacting the insulating layer. The post has a ring shape having an inner surface and an outer surface when viewed in a top view. When viewed in a top view, a maximum width of the inner surface is in a range of about 0.2 to about 0.8 times a maximum width of an upper surface of the first section, and a maximum width of the outer surface is in a range of about 1.2 times or more the maximum width of the upper surface of the first section.

According to an embodiment of the present inventive concepts, a semiconductor package includes a semiconductor chip. A base layer is disposed outside the semiconductor chip. A mold layer is interposed between the semiconductor chip and the base layer. The mold layer covers upper surfaces of the semiconductor chip and the base layer. A lower redistribution layer is on a lower surface of the semiconductor chip. An upper redistribution layer is on the mold layer. A conductive via electrically interconnects the lower redistribution layer and the upper redistribution layer. The conductive via extends through the base layer in a vertical direction. A connecting terminal is on a lower surface of the lower redistribution layer. The lower redistribution layer comprises an insulating layer, a redistribution pattern on the insulating layer, a via connected to an upper surface of the redistribution pattern and extending through the insulating layer in a vertical direction, an under bump metal (UBM) connected to a lower surface of the redistribution pattern, and a post connected to the upper surface of the redistribution pattern while vertically overlapping with the UBM. The UBM comprises a first section having an upper surface directly contacting the redistribution pattern, and a second section having an upper surface directly contacting the insulating layer. The post has a ring shape having an inner surface and an outer surface when viewed in a top view. When viewed in a top view, a maximum width of the inner surface is in a range of about 0.2 to 0.8 times a maximum width of an upper surface of the first section, and a maximum width of the outer surface is about 1.2 times or more the maximum width of the upper surface of the first section. A lateral edge of the upper surface of the first section vertically overlaps with the post.

DETAILED DESCRIPTION OF EMBODIMENTS

Figure 1:
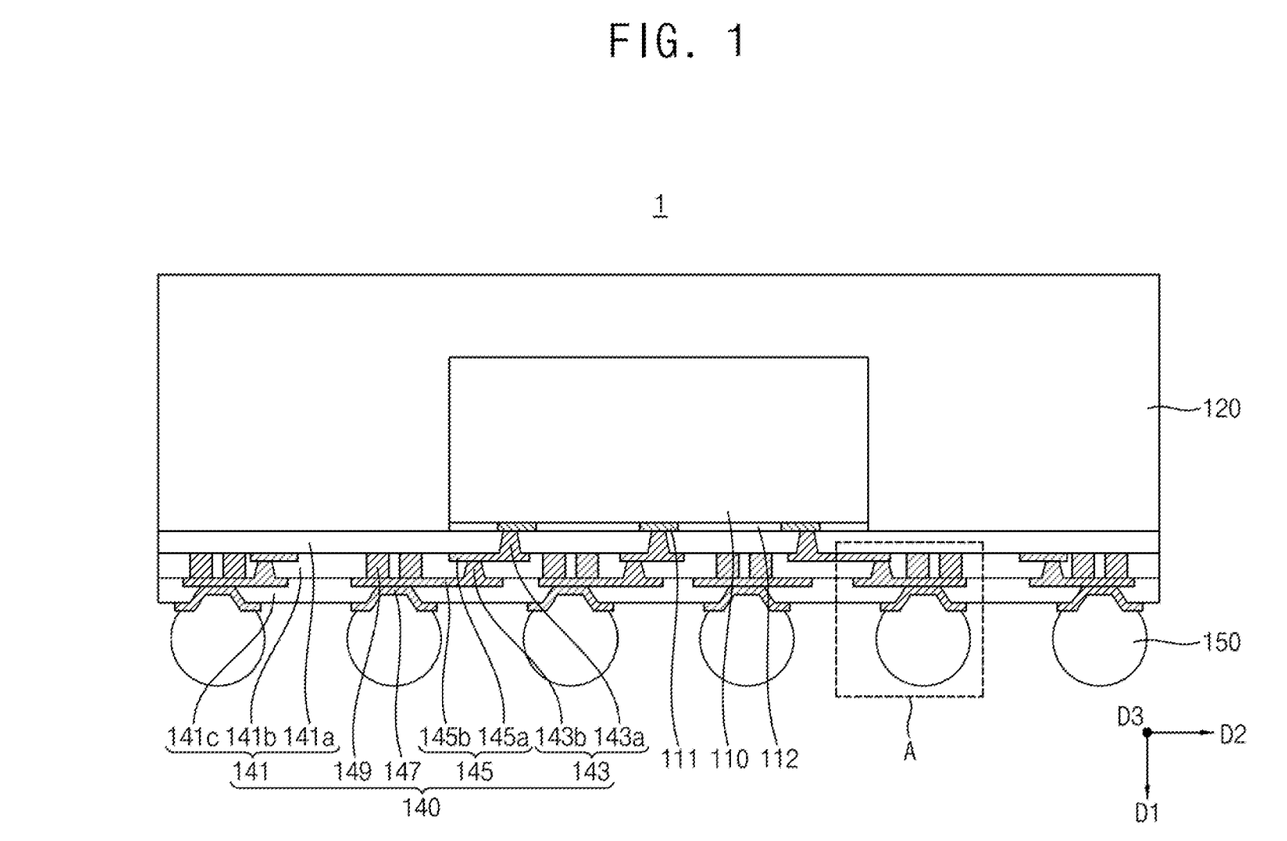
FIG. 1 is a cross-sectional view of a semiconductor package according to an embodiment of the present inventive concepts.
Figure 2:
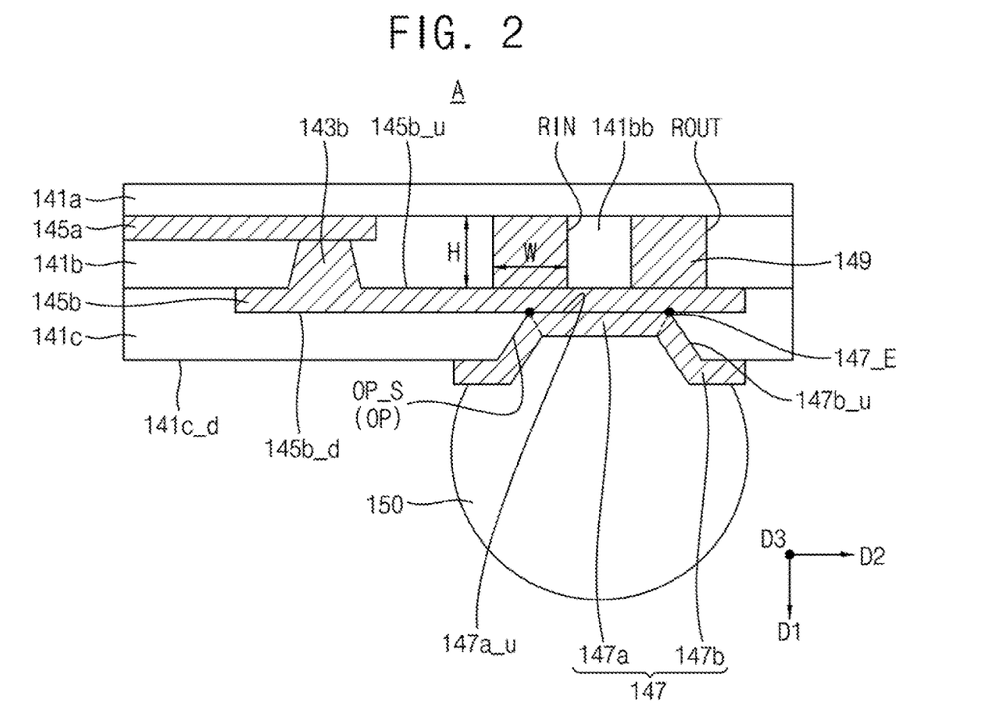
FIG. 2 is an enlarged view of a portion A in FIG. 1 according to an embodiment of the present inventive concepts.
Figure 3:
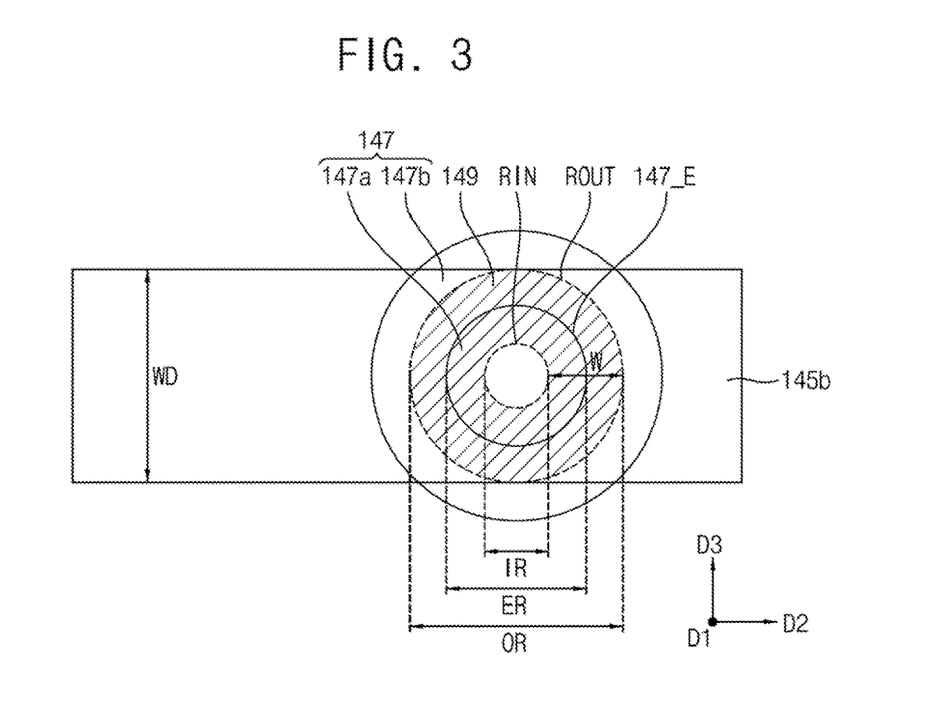
FIG. 3 is a plan view of a post, a redistribution pattern and an under bump metal (UBM) in FIG. 2 according to embodiments of the present inventive concepts.

FIG. 1 is a cross-sectional view of a semiconductor package according to an embodiment of the present inventive concepts. FIG. 2 is an enlarged view of a portion A in FIG. 1. FIG. 3 is a plan view of a post, a redistribution pattern and an under bump metal (UBM) in FIG. 2.

Referring to FIG. 1, in an embodiment, a semiconductor package 1 may be a wafer level package. For example, the semiconductor package 1 may be a fan-out wafer level package. However, embodiments of the present inventive concepts are not limited thereto. For example, in an embodiment, the semiconductor package 1 may be a fan-in wafer level package, differently from that of FIG. 1.

The semiconductor package 1 may include a semiconductor chip 110, a mold layer 120, a lower redistribution layer 140, and connecting terminals 150. As shown in the embodiment of FIG. 1, the semiconductor chip 110 may be disposed at a center of the semiconductor package 1. The semiconductor chip 110 may be disposed on an upper surface of the lower redistribution layer 140. The upper surface of the lower redistribution layer 140 may be a surface adjacent to the semiconductor chip 110. The semiconductor chip 110 may include chip pads 111 and a protective layer 112 disposed at a lower surface of the semiconductor chip 110. The lower surface of the semiconductor chip 110 may be a surface adjacent to the lower redistribution layer 140. For example, in an embodiment, the protective layer 112 may include silicon oxide and/or silicon nitride. The protective layer 112 may perform functions for protecting the semiconductor chip 110 and securing insulation among the chip pads 111 which are formed to be spaced apart from one another.

For example, the semiconductor chip 110 may be an integrated circuit in which elements are integrated in a chip. For example, the integrated circuit may be a processor chip such as such as a central processing unit (CPU), a graphics processing unit (GPU), a field programmable gate array (FPGA), a digital signal processor, a cryptoprocessor, a microprocessor, a microcontroller, etc., such as an application processor (AP). However, embodiments of the present inventive concepts are not limited thereto and the integrated circuit may vary. For example, the integrated circuit may also be a logic chip such as an analog-to-digital converter, an application-specific IC (ASIC), etc., or a memory chip such as a volatile memory (for example, DRAM), a non-volatile memory (for example, ROM), a flash memory, etc. In addition, such chips may be disposed in the form of a combination.

The mold layer 120 may be disposed on the upper surface of the lower redistribution layer 140. The mold layer 120 may cover the semiconductor chip 110. For example, the mold layer 120 may surround a lateral side surface of the semiconductor chip 110 while covering an upper surface of the semiconductor chip 110. The upper surface of the semiconductor chip 110 may be a surface opposite to the lower surface of the semiconductor chip 110 (e.g., in a first direction D1 that is parallel to a thickness direction of the semiconductor package 1). The mold layer 120 may cover the upper surface of the lower redistribution layer 140. For example, the mold layer 120 may include an epoxy molding compound (EMC). However, embodiments of the present inventive concepts are not limited thereto and the material of the mold layer 120 may vary.

The lower redistribution layer 140 may be disposed on the lower surface of the semiconductor chip 110 and a lower surface of the mold layer 120. The lower redistribution layer 140 may cover at least a portion of a lower surface of each chip pad 111 and a lower surface of the protective layer 112. The lower redistribution layer 140 may cover the lower surface of the mold layer 120. The lower redistribution layer 140 may be electrically connected to the semiconductor chip 110 and the connecting terminals 150.

The lower redistribution layer 140 may include insulating layers 141, redistribution patterns 145, vias 143, UBMs 147, and posts 149. The insulating layers 141 may be disposed on the lower surfaces of the semiconductor chip 110 and the mold layer 120. The insulating layers 141 may be sequentially stacked. In an embodiment, the insulating layers 141 may include a first insulating layer 141a, a second insulating layer 141b, and a third insulating layer 141c. However, embodiments of the present inventive concepts are not limited thereto and the number of layers of the insulating layers 141 may vary. The first insulating layer 141a, the second insulating layer 141b and the third insulating layer 141c may be sequentially stacked in the first direction D1 in which the first insulating layer 141a is closest to a lower surface of the semiconductor chip 110 and the third insulating layer 141c is farthest from the lower surface of the semiconductor chip 110. For example, as shown in the embodiment of FIG. 1, the first insulating layer 141a may be disposed on the lower surface of the semiconductor chip 110 (e.g., directly thereon in the first direction D1), the second insulating layer 141b may be disposed on a lower surface of the first insulating layer 141a (e.g., directly thereon in the first direction D1), and the third insulating layer 141c may be disposed on a lower surface of the second insulating layer 141b (e.g., directly thereon in the first direction D1).

In an embodiment, the insulating layers 141 may include a curable material. For example, each of the insulating layers 141 may be a material layer cured by heat or light. In an embodiment, the curable material included in the insulating layers 141 may include an inorganic material such as silicon oxide, silicon nitride or silicon oxynitride and/or a polyamide series polymer material. For example, the curable material included in the insulating layers 141 may include at least one of photosensitive polyimide (PSPI), polybenzoxazole (PBO), a phenolic polymer, a benzocyclobutene (BCB)

series polymer and an epoxy series polymer. However, embodiments of the present inventive concepts are not limited thereto.

The redistribution patterns 145 may be disposed on the insulating layers 141. For example, the redistribution patterns 145 may be disposed on lower or upper surfaces of the insulating layers 141, respectively. In an embodiment, the redistribution patterns 145 may include first redistribution patterns 145a and second redistribution patterns 145b. In an embodiment, the first redistribution patterns 145a may be disposed on the lower surface of the first insulating layer 141a, and the second redistribution patterns 145b may be disposed on the lower surface of the second insulating layer 141b. The first redistribution patterns 145a and the second redistribution patterns 145b may be disposed to be spaced apart from each other in the first direction D1. The redistribution patterns 145 may include a conductive material. For example, in an embodiment, the redistribution patterns 145 may include copper, a copper alloy, or aluminum. For example, the copper alloy may be a mixture of at least one of C, Ag, Co, Ta, In, Sn, Zn, Mn, Ti, Mg, Cr, Ge, Sr, Pt, Mg, Al and Zr with copper. However, embodiments of the present inventive concepts are not limited thereto.

The vias 143 may extend through the insulating layers 141 and, as such, may electrically interconnect the redistribution patterns 145 which are disposed on different layers of the insulating layers 141, respectively. In addition, the vias 143 may electrically interconnect the redistribution patterns 145 and the chip pads 111. In an embodiment, the vias 143 may include first vias 143a and second vias 143b. The first vias 143a may extend through the first insulating layer 141a in a vertical direction (e.g., in the first direction D1) and, as such, may interconnect the first redistribution patterns 145a and the chip pads 111. The second vias 143b may extend through the second insulating layer 141b in a vertical direction (e.g., in the first direction D1) and, as such, may interconnect the first redistribution patterns 145a and the second redistribution patterns 145b. The vias 143 may include a conductive material. For example, the vias 143 may include a material identical to a material included in the redistribution patterns 145. However, embodiments of the present inventive concepts are not limited thereto.

The UBMs 147 may be disposed on respective lower surfaces of the redistribution patterns 145 and a lower surface of the third insulating layer 141c. The UBMs 147 may extend through the third insulating layer 141c and, as such, may be connected to the second redistribution patterns 145b, respectively. At least a portion of an upper surface of each UBM 147 may directly contact the lower surface of a corresponding one of the second redistribution patterns 145b. An upper surface of each UBM 147 may be a surface adjacent to the corresponding second redistribution pattern 145b. At least a portion of each UBM 147 may protrude from the third insulating layer 141c and extend below the third insulating layer 141c. At least a portion of each UBM 147 may be disposed on a lower surface 141c_d of the third insulating layer 141c. The UBMs 147 may include a conductive material. For example, the UBMs 147 may include a material identical to the material included in the redistribution patterns 145. However, embodiments of the present inventive concepts are not limited thereto.

In an embodiment, the posts 149 may be disposed on the redistribution patterns 145. For example, as shown in the embodiment of FIG. 1, the posts 149 may be disposed on the second redistribution patterns 145b. The posts 149 may be connected to upper surfaces of the second redistribution patterns 145b. Each post 149 may vertically overlap with at least a portion of a corresponding one of the second redistribution patterns 145b and a corresponding one of the UBMs 147. In an embodiment, the posts 149 may include the same material as the vias 143, the redistribution patterns 145 and/or the UBMs 147. However, embodiments of the present inventive concepts are not limited thereto. For example, in an embodiment, the posts 149 may include a material different from those of the vias 143, the redistribution patterns 145 and/or the UBMs 147. For example, the posts 149 may include a semiconductor and/or an insulator. For example, the posts 149 may include an epoxy series material. A more detailed description of the posts 149 will be described later with reference to FIGS. 2 and 3.

The connecting terminals 150 may be disposed on the lower redistribution layer 140. The connecting terminals 150 may be connected to the UBMs 147, respectively. The connecting terminals 150 may be disposed on (e.g., directly thereon in the first direction D1) lower surfaces of the UBMs 147, respectively. The lower surface of each UBM 147 may be a surface opposite to the upper surface of the UBM 147 adjacent to the corresponding second redistribution pattern 145b. The connecting terminals 150 may be electrically connected to the semiconductor chip 110 through the UBMs 147, the redistribution patterns 145 and the vias 143. For example, in an embodiment, each of the connecting terminals 150 may be a solder ball. However, embodiments of the present inventive concepts are not limited thereto. In an embodiment, a portion of the connecting terminals 150 may vertically overlap (e.g., overlap in the first direction DR1) with the semiconductor chip 110. A portion of the connecting terminals 150 may not vertically overlap (e.g., overlap in the first direction DR1) with the semiconductor chip 110. A portion of the connecting terminals 150 may vertically overlap (e.g., overlap in the first direction DR1) with the mold layer 120.

Referring to FIGS. 2 and 3, the third insulating layer 141c may include an opening OP exposing the lower surface 145b_d of the second redistribution pattern 145b. At least a portion of the UBM 147 may be disposed in the opening OP, and may be connected to the second redistribution pattern 145b through the opening OP. The UBM 147 may include a first section 147a directly contacting the second redistribution pattern 145b, and a second section 147b directly contacting a lateral side surface OP_S of the opening OP of the third insulating layer 141c and the lower surface 141c_d of the third insulating layer 141c. For example, an upper surface 147a_u of the first section 147a may directly contact the lower surface 145b_d of the second redistribution pattern 145b. An upper surface 147a_u of the second section 147b may directly contact the third insulating layer 141c.

The post 149 may be disposed between the second redistribution pattern 145b and the first insulating layer 141a. The post 149 may be disposed at the same level as the second insulating layer 141b. The post 149 may be disposed on the upper surface 145b_u of the second redistribution pattern 145b. The post 149 may directly contact the lower surface of the first insulating layer 141a while directly contacting the upper surface 145b_u of the second redistribution pattern 145b. An upper surface of the post 149 may be coplanar (e.g., in the first direction D1) with an upper surface of the first redistribution pattern 145a. A height H of the post 149 (e.g., length in the first direction D1) may be equal to the thickness of the second insulating layer 141b. For example, in an embodiment, the height H of the post 149 may be in a range of about 2 to about 50 μm.

In an embodiment, the post 149 may have a ring shape when viewed in a top view (e.g., in a plane defined in a second direction D2 and a third direction D3). For example, the edge of the ring-shaped post 149 may have a circular shape or a polygonal shape when viewed in a top view. The ring-shaped post 149 may have an inner surface RIN and an outer surface ROUT. The inner surface RIN and the outer surface ROUT of the post 149 may have corresponding shapes, respectively, when viewed in a top view. For example, when the inner surface RIN is circular, the outer surface ROUT may also be circular, whereas, when the inner surface MN is polygonal, the outer surface ROUT may also be polygonal. The inner surface RIN may define a space positioned in the central portion of the ring-shaped post 149. In an embodiment, the space defined by the inner surface MN may be filled with a portion of the insulating layer 141. A minimum distance W between the inner surface RIN and the outer surface ROUT of the post 149 may be in a range of about 3 to about 200 μm. For example, the maximum thickness W (e.g., width) of the post 149 may be in a range of about 3 to about 200 μm. A portion 141bb of the second insulating layer 141b may be disposed inside the post 149. The portion 141bb of the second insulating layer 141b may contact the inner surface RIN of the post 149, and may contact the lower surface 145b_d of the second redistribution pattern 145b.

In an embodiment, the post 149 may vertically overlap (e.g., overlap in the first direction D1) with a lateral edge 147_E of the upper surface 147a_u of the first section 147a in the UBM 147. The lateral edge 147_E of the upper surface 147a_u of the first section 147a may be a point (or a boundary line) at which the upper surface 147a_u of the first section 147a and the upper surface 147a_u of the second section 147b meet each other. When viewed in a top view, a maximum width IR of the inner surface RIN of the post 149, such as the maximum width between two opposing surfaces of the inner surface RIN of the post 149 (e.g., opposing in the second and/or third directions D2, D3), may be less than a maximum width ER of the upper surface 147a_u of the first section 147a of the UBM 147 (or a maximum width ER of the lateral edge 147_E of the upper surface 147a_u). When viewed in a top view, a maximum width OR of the outer surface ROUT of the post 149 may be greater than the maximum width ER of the upper surface 147a_u of the first section 147a of the UBM 147 (or the maximum width ER of the lateral edge 147_E of the upper surface 147a_u). When viewed in a top view, the maximum width OR of the outer surface ROUT of the post 149 may be less than the maximum width of the UBM 147. However, embodiments of the present inventive concepts are not limited thereto. For example, when viewed in a top view, the maximum width IR of the inner surface RIN of the post 149 may be in a range of about 0.2 to about 0.8 times the maximum width ER of the upper surface 147a_u of the first section 147a of the UBM 147. When viewed in a top view, the maximum width OR of the outer surface ROUT of the post 149 may be in a range of about 1.2 times or more the maximum width ER of the upper surface 147a_u of the first section 147a in the UBM 147.

A portion of the second redistribution pattern 145b may be disposed between the post 149 and the UBM 147 (e.g., in the first direction D1). The second redistribution pattern 145b may extend longitudinally in the second direction D2 perpendicular to the first direction D1 and, as such, may interconnect the second via 143b and the post 149. The second redistribution pattern 145b may extend longitudinally in the second direction D2 and, as such, may interconnect the second via 143b and the UBM 147. In an embodiment, a width WD of the second redistribution pattern 145b in the third direction D3 may be greater than the maximum width ER of the upper surface 147a_u of the first section 147a of the UBM 147. The third direction D3 may be a direction perpendicular to both the first direction D1 and the second direction D2. While the first to third directions D1 to D3 have been described as being perpendicular to each other, embodiments of the present inventive concepts are not limited thereto and the first to third directions D1 to D3 may cross each other at various different angles. As shown in the embodiment of FIG. 3, the width WD of the second redistribution pattern 145b in the third direction D3 may be substantially equal to or greater than the maximum width OR of the outer surface ROUT of the post 149.

As the post 149 is disposed on the second redistribution pattern 145b such that the post 149 vertically overlaps (e.g., overlaps in the first direction D1) with the lateral edge 147_E of the first section 147a of the UBM 147, as described above, it may be possible to distribute stress transferred to the second redistribution pattern 145b by the connecting terminal 150 and the UBM 147 when the semiconductor package 1 is mounted on a main board. The post 149 may efficiently distribute stress to the outside of the post 149 through the outer surface ROUT, the inner surface RIN and the upper surface thereof. Accordingly, even when a solder ball having high stiffness is used for the connecting terminal 150, it may be possible to prevent generation of a crack at the second redistribution pattern 145b.

Figure 4:
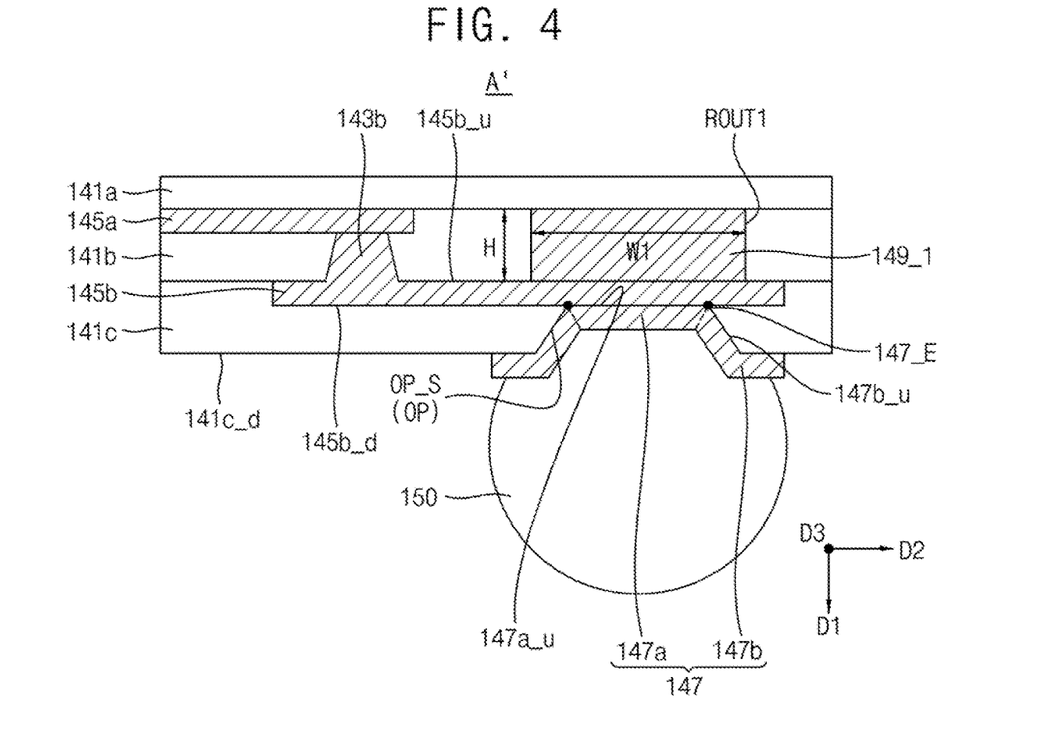
FIG. 4 is an enlarged view showing an embodiment of the portion A in FIG. 1 according to an embodiment of the present inventive concepts.
Figure 5:
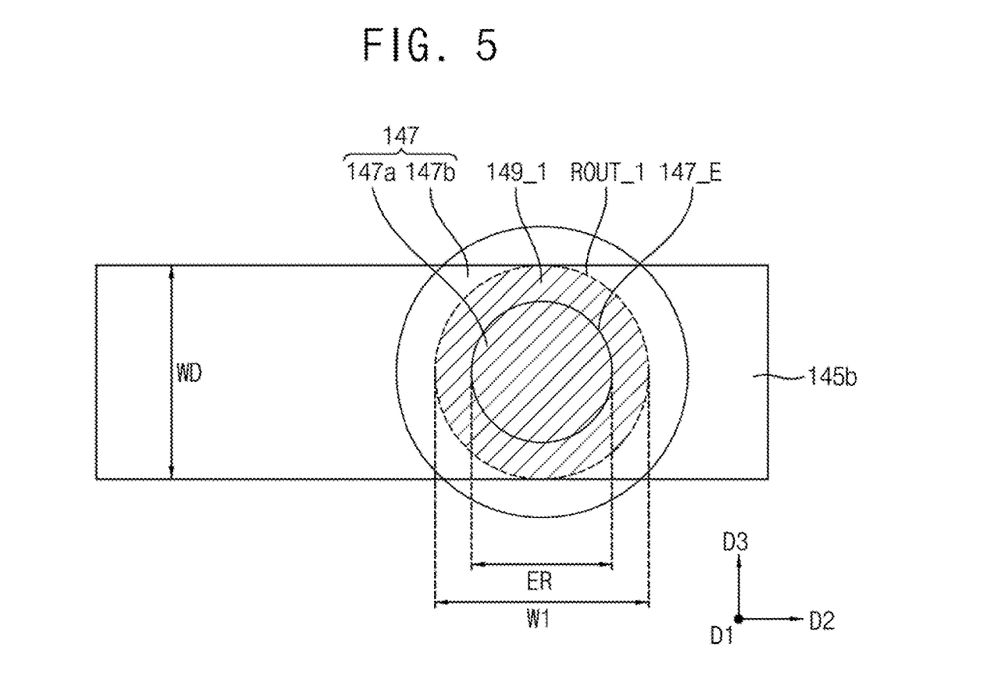
FIG. 5 is a plan view of a post, a redistribution pattern and a UBM in FIG. 4 according to embodiments of the present inventive concepts.

FIG. 4 is an enlarged view showing an embodiment of the portion A in FIG. 1, that is, a portion A'. FIG. 5 is a plan view of a post, a redistribution pattern and a UBM in FIG. 4.

Referring to the embodiments of FIGS. 4 and 5, the semiconductor package 1 may include a post 149_1. The post 149_1 differs from the post 149 described with reference to FIGS. 1 to 3 in that the post 149_1 has a circular shape or a polygonal shape when viewed in a top view and does not have space defined in a central portion of the post 149_1. For example, the post 149_1 does not have a ring shape, but has a circular shape or a polygonal shape, and, as such, includes only an outer surface ROUT_1 without including an inner surface RIN, differently from the post 149 described with reference to the embodiments of FIGS. 1 to 3.

The post 149_1 may vertically overlap with the UBM 147 (e.g., overlap in the first direction D1). The post 149_1 may vertically overlap with the lateral edge 147_E of the upper surface 147a_u of the first section 147a of the UBM 147. When viewed in a top view (e.g., in a plane defined in the second and third directions D2, D3), a maximum width W1 of the post 149_1 may be greater than the maximum width ER of the upper surface 147a_u of the first section 147a in the UBM 147. For example, the maximum width W1 of the post 149_1 may be in a range of about 100 to about 200 μm. A height H1 of the post 149_1 may be in a range of about 2 to about 50 μm.

Figure 6:
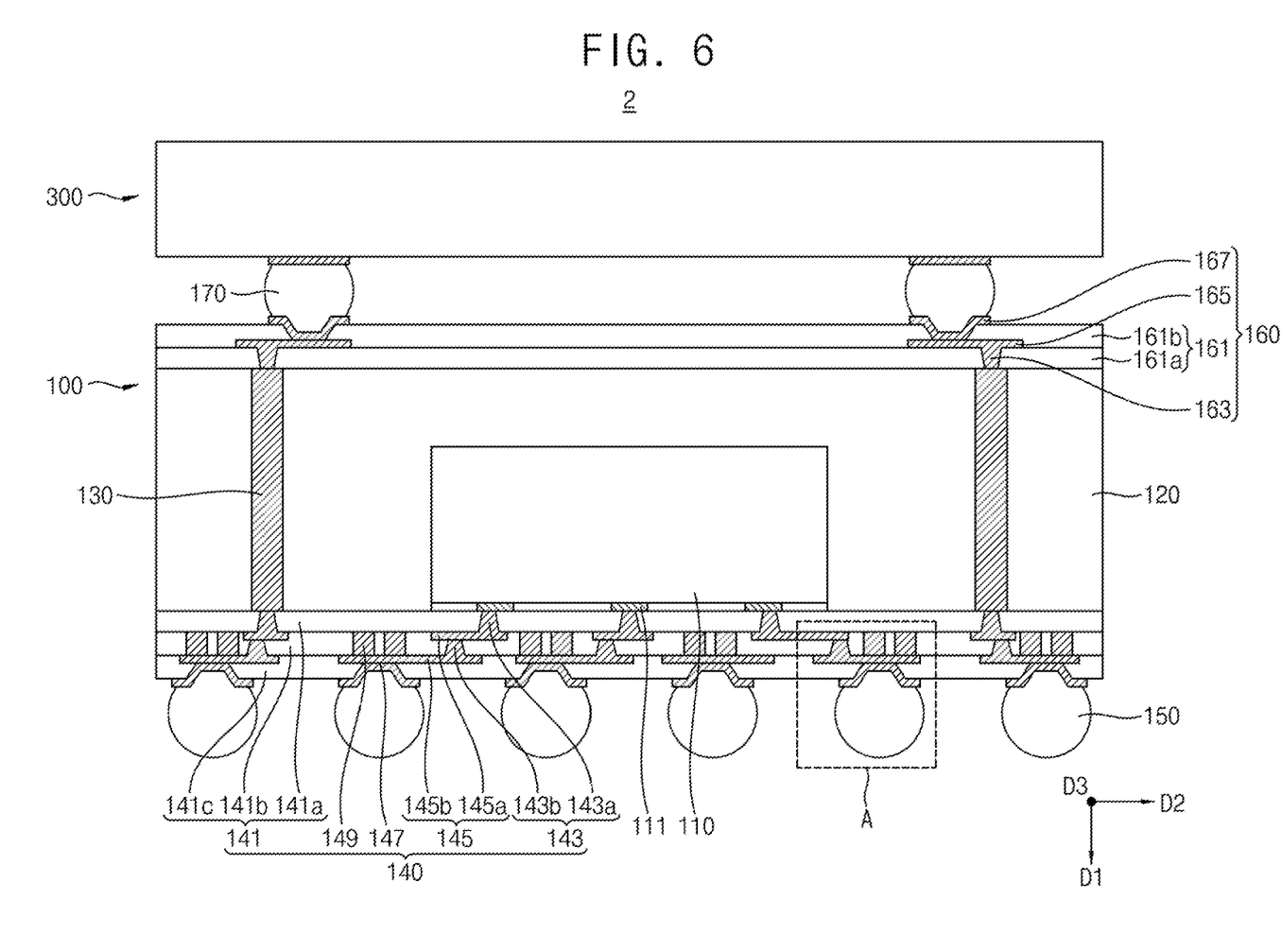
FIG. 6 is a cross-sectional view of a semiconductor package according to an embodiment of the present inventive concepts.

FIG. 6 is a cross-sectional view of a semiconductor package according to an embodiment of the present inventive concepts.

Referring to FIG. 6, a semiconductor package 2 may be a package-on-package (PoP) type package including a lower semiconductor package 100, and an upper semiconductor package 300 on the lower semiconductor package 100. The upper semiconductor package 300 may be disposed on the lower semiconductor package 100 via connecting terminals 170.

The lower semiconductor package 100 may include a lower redistribution layer 140 having the same configuration as the lower redistribution layer 140 included in the semiconductor package 1 described with reference to the embodiment of FIG. 1 and a repeated description will be omitted for convenience of explanation. The lower semiconductor package 100 may further include a through-mold via (TMV) 130 and an upper redistribution layer 160 in addition to the configuration of the semiconductor package 1 described with reference to FIG. 1. The TMV 130 may extend through a mold layer 120 in a vertical direction (e.g., the first direction D1). The TMV 130 may be disposed to be spaced apart from a lateral side surface of a semiconductor chip 110. The TMV 130 may electrically interconnect the upper redistribution layer 160 and a lower redistribution layer 140. The TMV 130 may include metal. For example, in an embodiment, the TMV 130 may include at least one of copper, aluminum, gold, lead, stainless steel, silver, and a combination thereof. However, embodiments of the present inventive concepts are not limited thereto. The TMV 130 may be formed through a plating process, or may be formed through a method in which a pillar-shaped structure is bonded to an upper surface of the lower redistribution layer 140.

The upper redistribution layer 160 may be disposed on an upper surface of a mold layer 120 and an upper surface of the semiconductor chip 110. For example, a lower surface of the upper redistribution layer 160 may directly contact an upper surface of the mold layer 120. The upper surface of the mold layer 120 may be a surface opposite to a lower surface of the mold layer 120 (e.g., in the first direction D1). The upper redistribution layer 160 may include insulating layers 161, redistribution patterns 165, vias 163, and UBMs 167. The insulating layers 161 may be sequentially stacked on the mold layer 120 (e.g., in the first direction D1). In an embodiment, the insulating layers 161 may include a first insulating layer 161a and a second insulating layer 161b. However, embodiments of the present inventive concepts are not limited thereto and the number of insulating layers 161 may vary. The first insulating layer 161a may cover the upper surface of the mold layer 120, and the second insulating layer 161b may be disposed on the first insulating layer 161a (e.g., directly thereon in the first direction D1). The redistribution patterns 165 may be disposed on the insulating layers 161. For example, as shown in the embodiment of FIG. 6, the redistribution patterns 165 may be disposed on an upper surface of the first insulating layer 161a. The vias 163 may extend through the insulating layers 161 (e.g., in the first direction D1). For example, the vias 163 may extend through the first insulating layer 161a and, as such, may be electrically connected to the TMV 130. The vias 163 may electrically interconnect the TMV 130 and the redistribution patterns 165. The UBMs 167 may be disposed on the redistribution patterns 165 and the insulating layers 161. For example, the UBMs 167 may extend through the second insulating layer 161b and, as such, may be connected to the redistribution patterns 165.

The upper semiconductor package 300 and the connecting terminals 170 may be disposed on the upper redistribution layer 160. The upper semiconductor package 300 may be electrically connected to the upper redistribution layer 160 through the connecting terminals 170.

Figure 7:
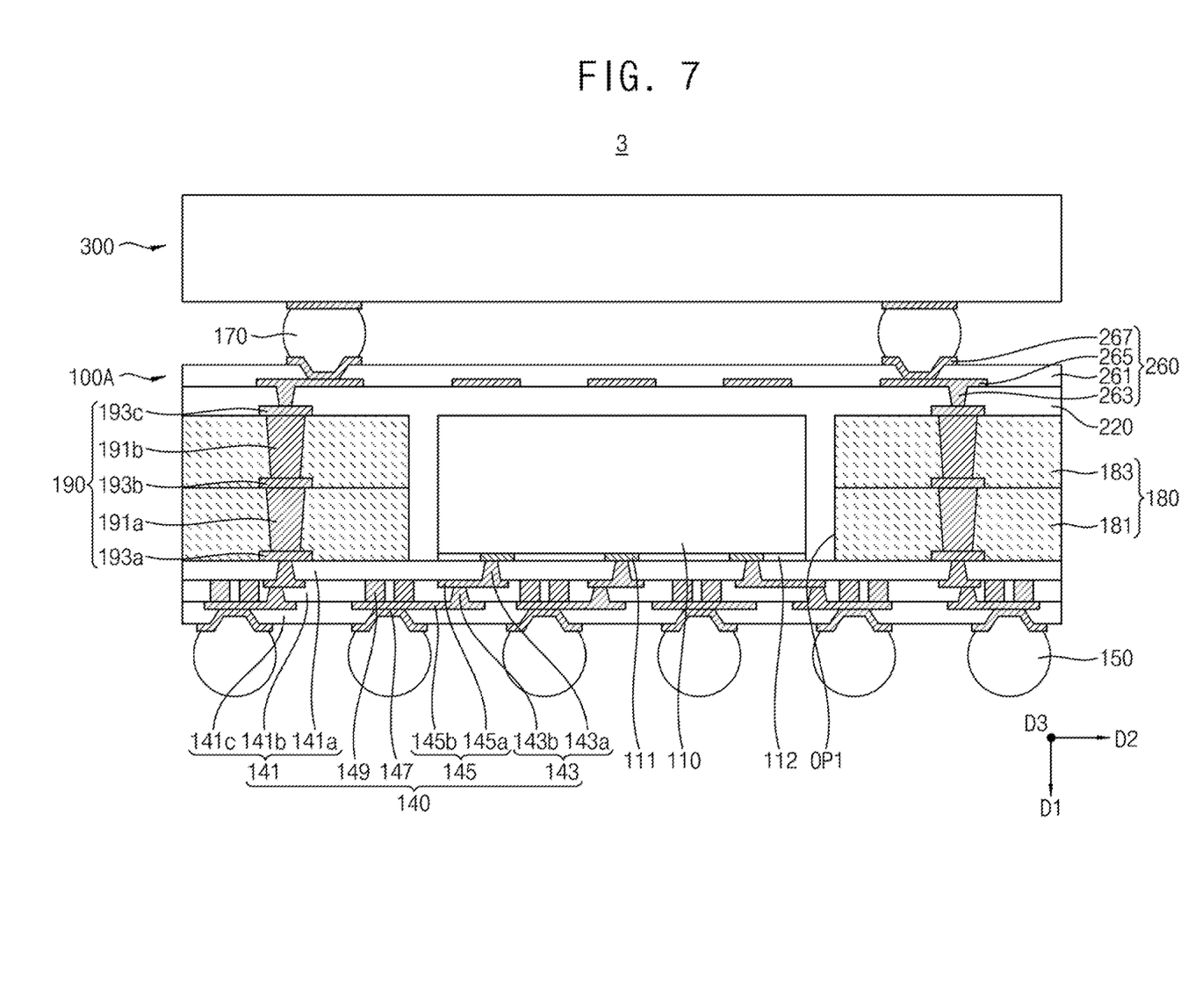
FIG. 7 is a cross-sectional view of a semiconductor package according to an embodiment of the present inventive concepts.

FIG. 7 is a cross-sectional view of a semiconductor package according to an embodiment of the present inventive concepts.

Referring to the embodiment of FIG. 7, a semiconductor package 3 may include a lower semiconductor package 100A, and an upper semiconductor package 300 on the lower semiconductor package 100A. The upper semiconductor package 300 may be disposed on the lower semiconductor package 100A via connecting terminals 170. For example, the upper semiconductor package 300 may be disposed on the upper redistribution layer 260 with the connecting terminals 170 disposed therebetween (e.g., in the first direction D1).

In an embodiment, the lower semiconductor package 100A may include a semiconductor chip 110, a lower redistribution layer 140, connecting terminals 150, base layers 180, a conductive connector 190, a mold layer 220, and an upper redistribution layer 260. The semiconductor chip 110 may be disposed on an upper surface of the lower redistribution layer 140. The connecting terminals 150 may be disposed on a lower surface of the lower redistribution layer 140. The lower redistribution layer 140 and the connecting terminals 150 may have the same configurations as the lower redistribution layer 140 and the connecting terminals 150 included in the semiconductor package 1 of the embodiments of FIGS. 1 to 3, respectively and repeated descriptions will be omitted for convenience of explanation. In an embodiment, the lower redistribution layer 140 may have the same configuration as the lower redistribution layer 140 described with reference to the embodiments of FIGS. 4 and 5 and a repeated description will be omitted for convenience of explanation.

The base layers 180 may be disposed on the upper surface of the lower redistribution layer 140. The base layers 180 may be disposed outside the semiconductor chip 110. When viewed in a top view, the base layers 180 may surround a lateral side surface of the semiconductor chip 110. The base layers 180 may include an opening OP1 extending through the base layers 180 in the first direction D1. The semiconductor chip 110 may be disposed in the opening OP1. The size of the opening OP1 (e.g., length in the second direction D2) may be greater than the size of the semiconductor chip 110 (e.g., length in the second direction D2). Accordingly, the semiconductor chip 110 and the base layers 180 may be spaced apart from each other in the second direction D2.

In an embodiment, the base layers 180 may include a first base layer 181 and a second base layer 183. However, embodiments of the present inventive concepts are not limited thereto and the number of the layers included in the base layers 180 may vary. The first base layer 181 and the second base layer 183 may be sequentially stacked on the upper surface of the lower redistribution layer 140 (e.g., in the first direction D1). The first base layer 181 may be disposed on the lower redistribution layer 140 (e.g., directly thereon in the first direction D1), and the second base layer 183 may be disposed on the first base layer 181 (e.g., directly thereon in the first direction D1). For example, the base layers 180 may be a printed circuit board (PCB). In an embodiment, the base layers 180 may include a non-conductive material. For example, the base layers 180 may include a carbon-containing material (for example, graphite or graphene), ceramic, or a polymer (e.g., polycarbonate, nylon, or high-density polyethylene (HDPE)).

At least a portion of the conductive connector 190 may extend through the base layers 180 in a vertical direction (e.g., the first direction D1) and, as such, the conductive connector 190 may electrically interconnect the lower redistribution layer 140 and the upper redistribution layer 260. The connective connector 190 may include conductive pads and conductive vias. In an embodiment, the conductive pads may include first conductive pads 193a, second conductive pads 193b, and third conductive pads 193c. The conductive vias may include first conductive vias 191a and second conductive vias 191b. The first conductive pads 193a may be disposed on the lower redistribution layer 140 (e.g., directly thereon in the first direction D1). The first conductive pads 193*a* may be electrically connected to vias 143 and redistribution patterns 145 of the lower redistribution layer 140. For example, the first conductive pads 193*a* may be directly connected to the vias 143 of the lower redistribution layer 140. The first conductive pads 193*a* may be disposed on a lower surface of the first base layer 181. The lower surface of the first base layer 181 may be a surface adjacent to the lower redistribution layer 140. The second conductive pads 193*b* may be disposed on an upper surface of the first base layer 181. The upper surface of the first base layer 181 may be a surface opposite to the lower surface of the first base layer 181 (e.g., in the first direction D1). The third conductive pads 193*c* may be disposed on an upper surface of the second base layer 183.

The first conductive vias 191*a* may extend through the first base layer 181 in a vertical direction (e.g., the first direction D1). The first conductive vias 191*a* may be connected to respective first conductive pads 193*a* and respective second conductive pads 193*b* and, as such, may electrically interconnect the first conductive pads 193*a* and the second conductive pads 193*b*. The second conductive vias 191*b* may extend through the second base layer 183 in a vertical direction (e.g., the first direction D1). The second conductive vias 191*b* may be connected to respective second conductive pads 193*b* and respective third conductive pads 193*c* and, as such, may electrically interconnect the second conductive pads 193*b* and the third conductive pads 193*c*. The conductive pads 193*a*, 193*b* and 193*c* and the conductive vias 191*a* and 191*b* may vertically overlap with one another (e.g., overlap in the first direction D1). In an embodiment, the conductive connector 190 may include copper, nickel, aluminum, gold, silver, stainless steel, or a combination thereof. However, embodiments of the present inventive concepts are not limited thereto.

The mold layer 220 may be disposed on the semiconductor chip 110 and the base layers 180. The mold layer 220 may extend between (e.g., be interposed between in the second direction D2) the semiconductor chip 110 and the base layers 180 and, as such, may fill the opening OP1 of the base layers 180. For example, the mold layer 220 may cover an upper side and lateral sides of the semiconductor chip 110 and may completely fill the opening OP1.

The upper redistribution layer 260 may be disposed on the mold layer 220 (e.g., directly thereon in the first direction D1). The upper redistribution layer 260 may include insulating layers 261, vias 263, redistribution patterns 265, and UBMs 267. The insulating layers 261 may cover an upper surface of the mold layer 220. The insulating layer 261 may include the same material as the insulating layers 141 of the lower redistribution layer 140. In an embodiment, the insulating layer 261 may include prepreg, an Ajinomoto build-up film (ABF), FR-4, bismaleimide triazine (BT), solder resist, or photoimageable dielectric (PID). However, embodiments of the present inventive concepts are not limited thereto. The vias 263 may extend through the mold layer 220 in a vertical direction (e.g., the first direction D1) and, as such, may be electrically connected to the third conductive pads 193*c*. The redistribution patterns 265 may be disposed on the upper surface of the mold layer 220. The redistribution patterns 265 may be connected to the vias 263, respectively. The insulating layer 261 may cover at least a portion of the redistribution patterns 265. The UBMs 267 may extend through the insulating layer 261 and, as such, may be connected to the redistribution patterns 265, respectively. The connecting terminals 170 may be disposed on the UBMs 267, respectively, and, as such, the upper semiconductor package 300 may be disposed on the lower semiconductor package 100A via the connecting terminals 170.

Figure 8:
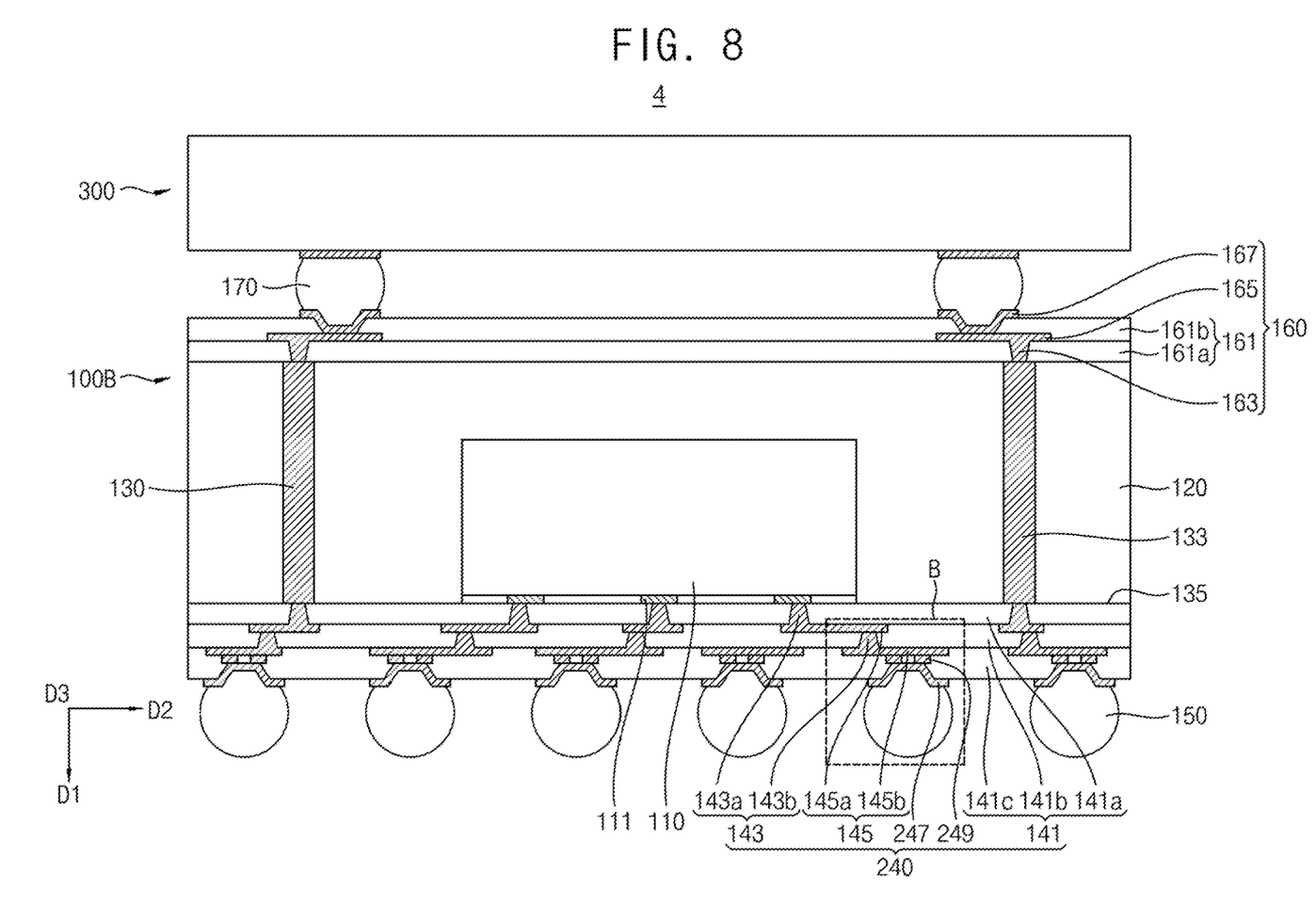
FIG. 8 is a cross-sectional view of a semiconductor package according to an embodiment of the present inventive concepts.
Figure 9:
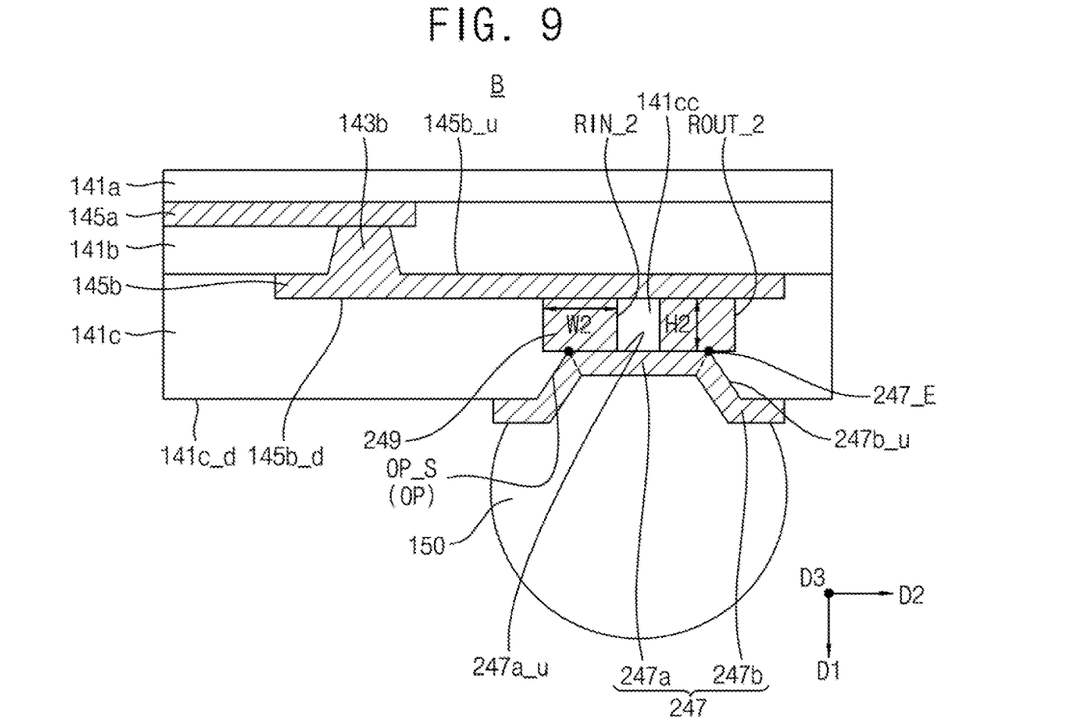
FIG. 9 is an enlarged view of a portion B in FIG. 8 according to an embodiment of the present inventive concepts.
Figure 10:
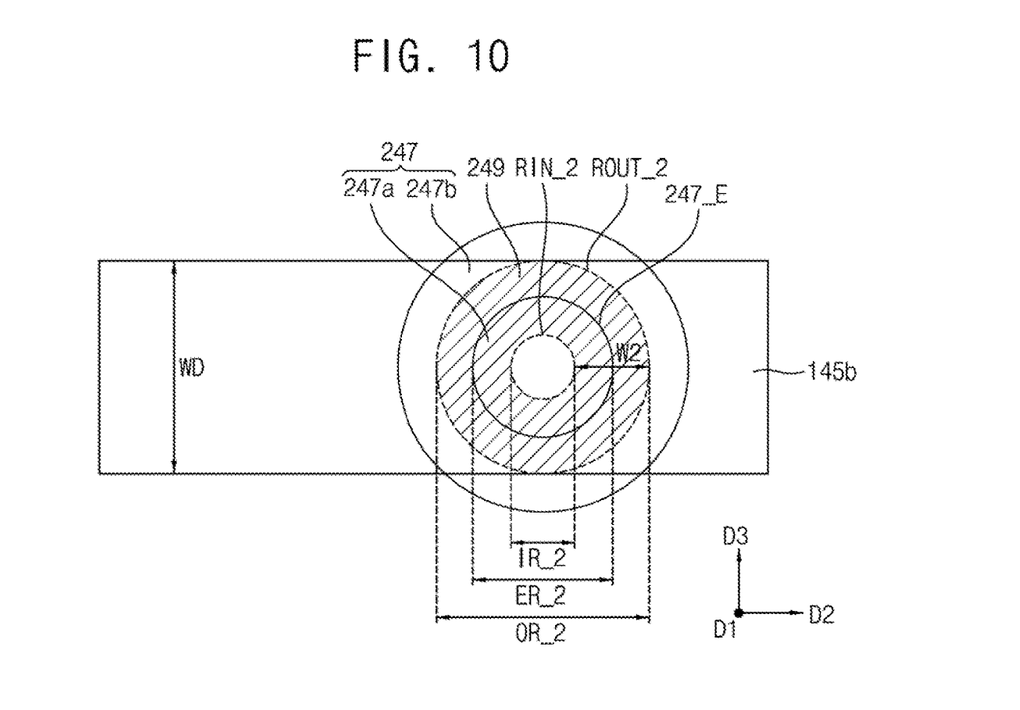
FIG. 10 is a plan view of a post, a redistribution pattern and a UBM in FIG. 9 according to embodiments of the present inventive concepts.

FIG. 8 is a cross-sectional view of a semiconductor package according to an embodiment of the present inventive concepts. FIG. 9 is an enlarged view of a portion B in FIG. 8. FIG. 10 is a plan view of a post, a redistribution pattern and a UBM in FIG. 9.

Referring to the embodiment of FIG. 8, a semiconductor package 4 differs from the semiconductor package 2 of the embodiment of FIG. 6 in that the semiconductor package 4 includes a lower redistribution layer 240 including a post 249 disposed between a redistribution pattern 145 and a UBM 247 (e.g., in the first direction D1).

Referring to the embodiments of FIGS. 9 and 10, the post 249 may be disposed between a second redistribution pattern 145*b* and the UBM 247 (e.g., in the first direction D1). The post 249 may directly contact a lower surface 145*b*_*d* of the second redistribution pattern 145*b*, and may directly contact an upper surface 247*a*_*u* of the UBM 247.

A third insulating layer 141*c* may include an opening OP exposing at least a portion of the post 249. At least a portion of the UBM 247 may be disposed in the opening OP and, as such, the UBM 247 may be connected to the post 249 through the opening OP. The UBM 247 may include a first section 247*a* directly contacting the post 249 at an upper surface thereof, and a second section 247*b* contacting a side surface OP_S of the opening OP of the third insulating layer 141*c* and a lower surface 141*c*_*d* of the third insulating layer 141*c* at an upper surface thereof.

In an embodiment, the post 249 may have a ring shape when viewed in a top view (e.g., in a plane defined in the second and third directions D2, D3). For example, the edge of the ring-shaped post 249 may have a circular shape or a polygonal shape. The ring-shaped post 249 may have an inner surface RIN_2 and an outer surface ROUT_2. In an embodiment, the inner surface RIN_2 and the outer surface ROUT_2 of the post 249 may have corresponding shapes, respectively, when viewed in a top view. For example, when the inner surface RIN_2 is circular, the outer surface ROUT_2 may also be circular, whereas, when the inner surface RIN_2 is polygonal, the outer surface ROUT_2 may also be polygonal. A minimum distance W2 between the inner surface RIN_2 and the outer surface ROUT_2 of the post 249 may be in a range of about 3 to about 200 µm. For example, the thickness W2 of the post 249 may be in a range of about 3 to about 200 µm. A portion 141*cc* of the third insulating layer 141*c* may be disposed inside the post 249. The portion 141*cc* of the third insulating layer 141*c* disposed inside the post 249 may contact the inner surface RIN_2 of the post 249, and may directly contact the lower surface 145*b*_*d* of the second redistribution pattern 145*b* and the upper surface 247*a*_*u* of the first section 247*a* of the UBM 247.

In an embodiment, the post 249 may vertically overlap with the UBM 247 (e.g., overlap in the first direction D1). The post 249 may vertically overlap with a lateral edge 247_E of the upper surface 247*a*_*u* of the first section 247*a* in the UBM 247. The lateral edge 247_E of the upper surface 247*a*_*u* of the first section 247*a* may be a point at which the upper surface 247*a*_*u* of the first section 247*a* and an upper surface 247*b*_*u* of the second section 247*b* meet each other. When viewed in a top view (e.g., in a plane defined in the second and third directions D2, D3), a maximum width IR_2 of the inner surface RIN_2 of the post 249 may be less than a maximum width ER_2 of the upper surface 247*a*_*u* of the first section 247*a* of the UBM 247 (or a maximum width ER_2 of the lateral edge 247_E of the upper surface 247a_u). A maximum width OR_2 of the outer surface ROUT_2 of the post 249 may be greater than the maximum width ER_2 of the upper surface 247a_u of the first section 247a in the UBM 247 (or the maximum width ER_2 of the lateral edge 247_E of the upper surface 247a_u). The maximum width OR_2 of the outer surface ROUT_2 of the post 249 may be less than the maximum width of the UBM 247. However, embodiments of the present inventive concepts are not limited thereto. For example, in an embodiment, the maximum width IR_2 of the inner surface RIN_2 of the post 249 may be in a range of about 0.2 to about 0.8 times the maximum width ER_2 of the upper surface 247a_u of the first section 247a in the UBM 247. The maximum width OR_2 of the outer surface ROUT_2 of the post 249 may be in a range of about 1.2 times or more the maximum width ER_2 of the upper surface 247a_u of the first section 247a in the UBM 247. However, embodiments of the present inventive concepts are not limited thereto.

The second redistribution pattern 145b may be disposed between a second via 143b and the post 249 (e.g., in the first direction D1). The second redistribution pattern 145b may extend longitudinally in the second direction D2 perpendicular to the first direction D1 and, as such, may interconnect the second via 143b and the post 249. A width WD of the second redistribution pattern 145b in a third direction D3 may be greater than the maximum width ER_2 of the upper surface 247a_u of the first section 247a in the UBM 247. In an embodiment, the width WD of the second redistribution pattern 145b in the third direction D3 may be substantially equal to or greater than the maximum width OR_2 of the outer surface ROUT_2 of the post 249.

Figure 11:
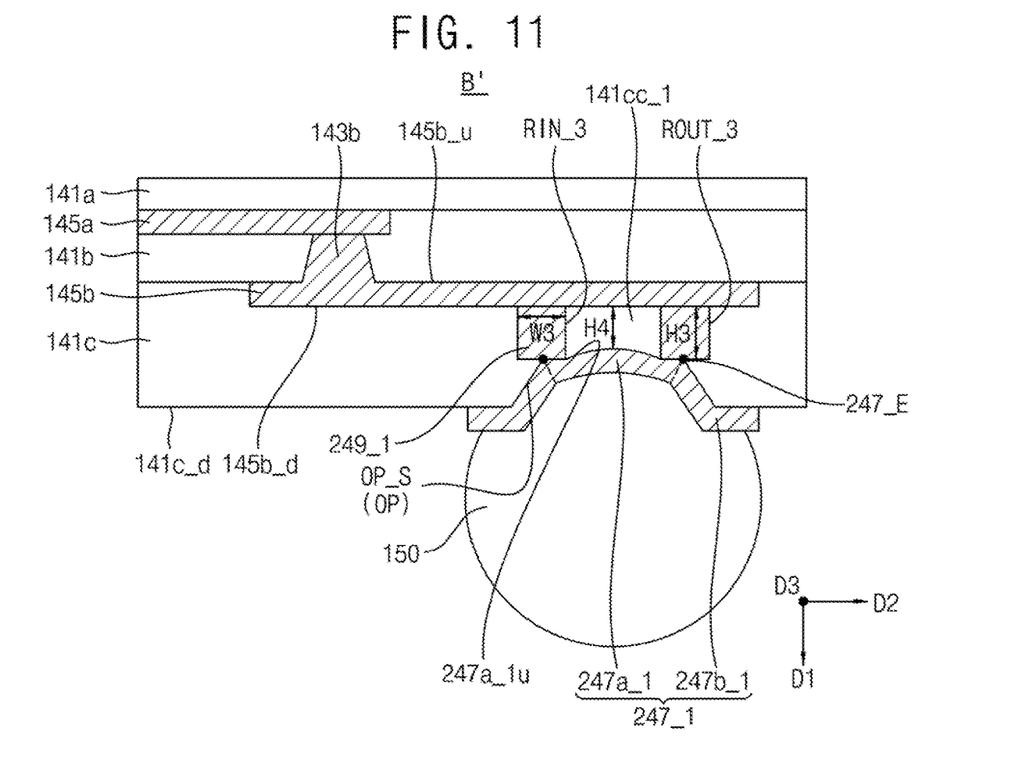
FIG. 11 is an enlarged view showing an embodiment of a portion B in FIG. 8 according to an embodiment of the present inventive concepts.
Figure 12:
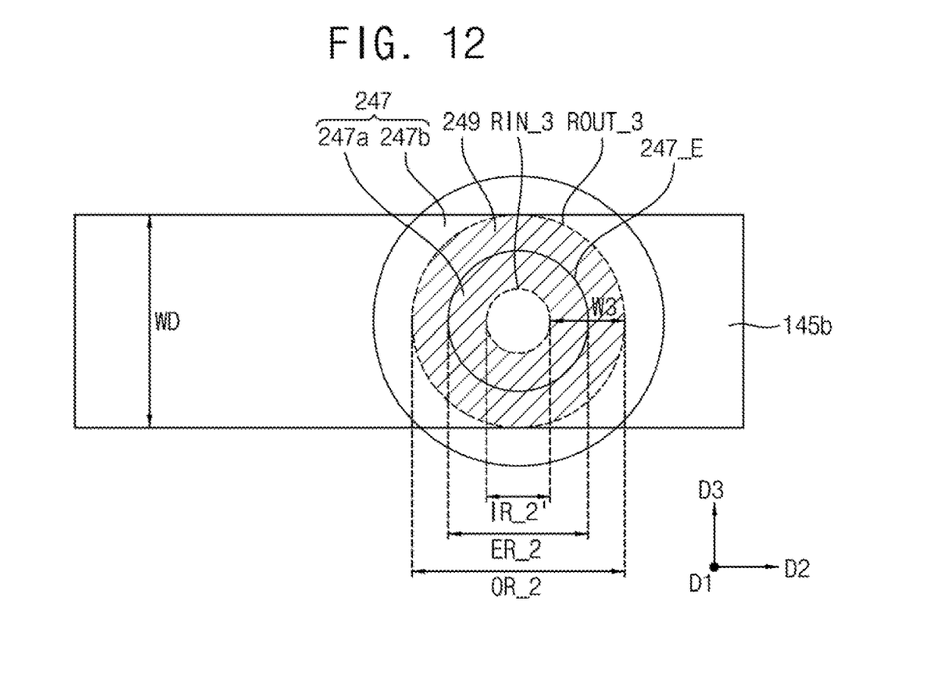
FIG. 12 is a plan view of a post, a redistribution pattern and a UBM in FIG. 11 according to embodiments of the present inventive concepts.

FIG. 11 is an enlarged view showing an embodiment of a portion B in FIG. 8. FIG. 12 is a plan view of a post, a redistribution pattern and a UBM in FIG. 11.

Referring to the embodiments of FIGS. 11 and 12, a semiconductor package 4 may include a UBM 247_1. The UBM 247_1 differs from the UBM 247 described with reference to FIGS. 8 to 10 in that, although the UBM 247_1 includes a first section 247a_1 and a second section 247b_1, the first section 2147a_1 is bent to be convex in a direct towards the post 249_1.

The post 249_1 may have a ring shape when viewed in a top view (e.g., in a plane defined in the second and third directions D2, D3), and may include an inner surface RIN_3 and an outer surface ROUT_3. A portion 141cc_ of the third insulating layer 141c may be disposed inside the post 249_1 in the space defined by the inner surface RIN_3. In an embodiment, a lower surface of the portion 141cc_1 of the third insulating layer 141c disposed inside the post 249_1 may directly contact the UBM 247_1, and may be recessed to be concave in a direction towards the second redistribution pattern 145b. The first section 247a_1 of the UBM 247_1 may extend along the lower surface of the portion 141cc_1 of the third insulating layer 141c and, as such, may be formed to be convex toward the portion 141cc_1 of the third insulating layer 141c.

A minimum distance H4 (e.g., length in the first direction D1) between the UBM 247_1 and the redistribution pattern 145 may be less than a height H3 of the post 249_1 (e.g., length in the first direction D1). The minimum distance between the upper surface 247a_1u of the first section 247a_1 of the UBM 247_1 and the lower surface 145b_d of the second redistribution pattern 145b, that is, the minimum distance H4, may be less than the height H3 of the post 249_1. For example, the height H3 of the post 249_1 may be in a range of about 2 to about 50 μm.

When the first section 247a_1 of the UBM 247_1 is convex toward the portion 141cc_1 of the third insulating layer 141c, as shown in FIG. 11, the contact area between the connecting terminal 150 and the UBM 247_1 may increase. Accordingly, it may be possible to more easily distribute stress of the UBM 247_1 generated due to the connecting terminal 150 and the UBM 247_1 when the semiconductor package 4 is connected to a main board.

Figure 13:
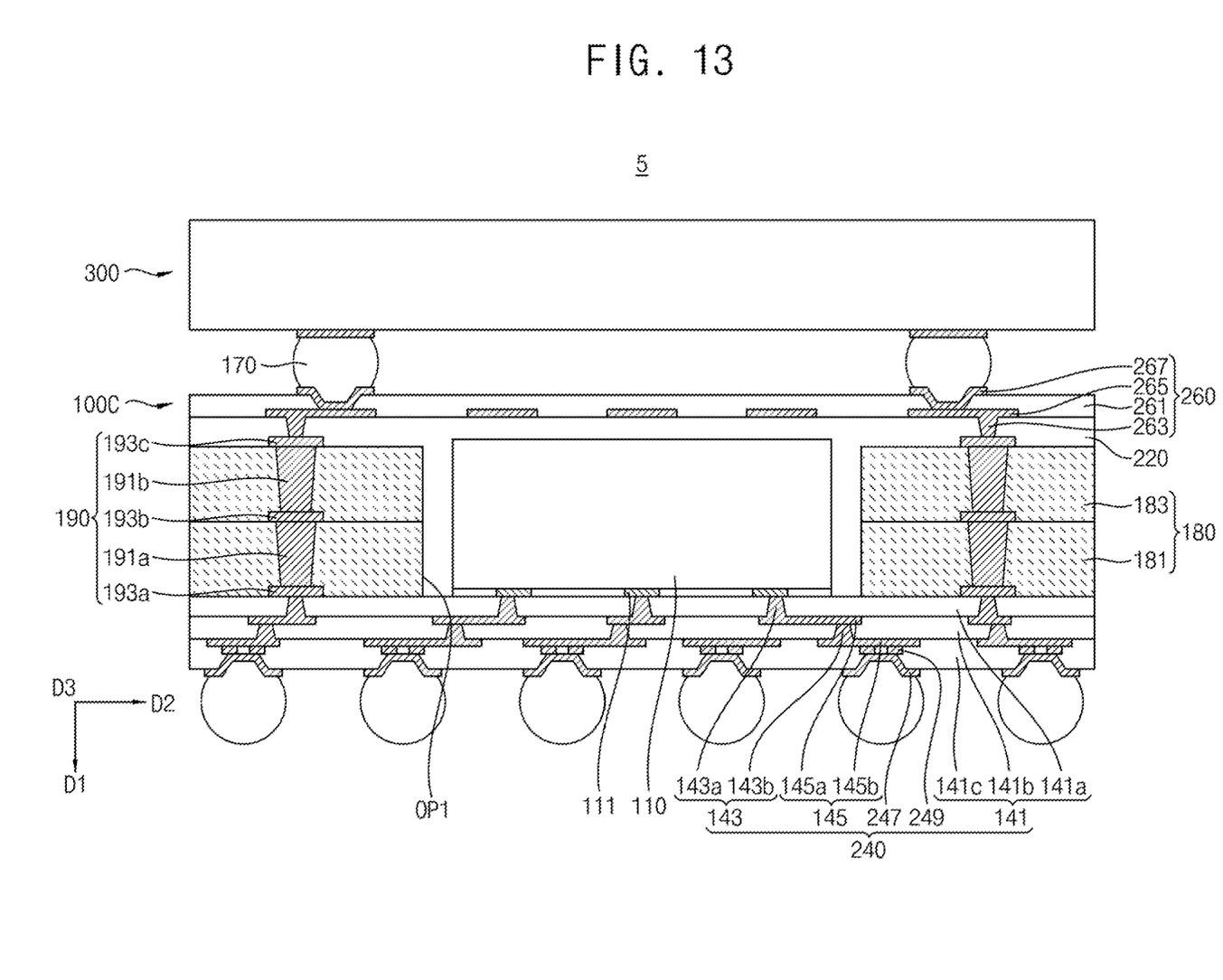
FIG. 13 is a cross-sectional view of a semiconductor package according to an embodiment of the present inventive concepts.

FIG. 13 is a cross-sectional view of a semiconductor package according to an embodiment of the present inventive concepts.

Referring to the embodiment of FIG. 13, a semiconductor package 5 may include a lower semiconductor package 100C, and an upper semiconductor package 300 on the lower semiconductor package 100C. The upper semiconductor package 300 may be disposed on the lower semiconductor package 100C via connecting terminals 170.

The lower semiconductor package 100C differs from the lower semiconductor package 100A described with reference to FIG. 7 in that the lower semiconductor package 100C includes a lower redistribution layer 240 including a post 249 disposed between a second redistribution pattern 145b and a UBM 247 (e.g., in the first direction D1). The lower redistribution layer 240 included in the lower semiconductor package 100C may have the same configuration as the lower redistribution layer 240 described with reference to FIGS. 8 to 10 and a repeated description will be omitted for convenience of explanation. In an embodiment, the lower redistribution layer 240 included in the lower semiconductor package 100C may have the same configuration as the lower redistribution layer 240 described with reference to FIGS. 11 and 12 and a repeated description will be omitted for convenience of explanation.

In accordance with the embodiments of the present inventive concepts, even in instances in which a connecting terminal having high stiffness is utilized, it may be possible to distribute stress caused by a connecting terminal and an under bump metal (UBM) when a semiconductor package and a main board are connected. As such, generation of a crack at a redistribution pattern connected to the UBM may be prevented. Accordingly, a semiconductor package increased in board-level reliability may be provided.

While embodiments of the present inventive concepts have been described with reference to the accompanying drawings, it should be understood by those skilled in the art that various modifications may be made without departing from the scope of the present inventive concepts and without changing essential features thereof. Therefore, the above-described embodiments should be considered in a descriptive sense only and not for purposes of limitation.

What is claimed is:
1. A semiconductor package comprising:
a semiconductor chip;
a lower redistribution layer on a lower surface of the semiconductor chip, the lower redistribution layer comprising an insulating layer, a redistribution pattern on the insulating layer, a via connected to an upper surface of the redistribution pattern and extending through the insulating layer in a vertical direction, an under bump metal (UBM) disposed on a lower surface of the redistribution pattern, and a post disposed on the upper surface of the redistribution pattern, the post vertically overlaps with the UBM; and
a connecting terminal connected to the UBM;
wherein the UBM comprises a first section having an upper surface directly contacting the redistribution pat- tern, and a second section having an upper surface directly contacting the insulating layer, and wherein the post overlaps an entirety of a lateral edge of the upper surface of the first section of the UBM.

2. The semiconductor package according to claim 1, wherein:
the post has an outer surface; and
a maximum width of the outer surface is greater than the maximum width of the upper surface of the first section.

3. The semiconductor package according to claim 2, wherein:
the maximum width of the outer surface is in a range of about 1.2 times or more the maximum width of the upper surface of the first section.

4. The semiconductor package according to claim 2, wherein the redistribution pattern is disposed between the post and the UBM in a first direction, and interconnects the via and the post, and the redistribution pattern longitudinally extends in a second direction perpendicular to the first direction, and a width of the redistribution pattern in a third direction perpendicular to the second direction is greater than or equal to the maximum width of the outer surface of the post.

5. The semiconductor package according to claim 2, wherein the post has a circular shape when viewed in a top view.

6. The semiconductor package according to claim 2, wherein the post has a polygonal shape when viewed in a top view.

7. The semiconductor package according to claim 1, wherein a height of the post is in a range of about 2 to about 50 μm.

8. The semiconductor package according to claim 1, wherein:
the insulating layer comprises a first insulating layer, a second insulating layer, and a third insulating layer that are sequentially stacked on the lower surface of the semiconductor chip;
the redistribution pattern comprises a first redistribution pattern on a lower surface of the first insulating layer, and a second redistribution pattern on a lower surface of the second insulating layer; and
the via comprises a first via connecting the semiconductor chip and the first redistribution pattern while extending through the first insulating layer in the vertical direction, and a second via electrically interconnecting the first redistribution pattern and the second redistribution pattern while extending through the second insulating layer in the vertical direction.

9. The semiconductor package according to claim 8, wherein the post directly contacts an upper surface of the second redistribution pattern.

10. The semiconductor package according to claim 8, wherein an upper surface of the post is coplanar with an upper surface of the first redistribution pattern.

11. The semiconductor package of claim 1, wherein:
the insulating layer comprises a first insulating layer and a second insulating layer directly below the first insulating layer; and
an upper surface of the post directly contacts the first insulating layer.

12. A semiconductor package comprising:
a semiconductor chip;
a lower redistribution layer on a lower surface of the semiconductor chip, the lower redistribution layer comprising an insulating layer, a redistribution pattern on the insulating layer, a via connected to an upper surface of the redistribution pattern and extending through the insulating layer in a vertical direction, an under bump metal (UBM) on a lower surface of the redistribution pattern, and a post between the redistribution pattern and the UBM;
a mold layer on the lower redistribution layer, the mold layer surrounding a lateral side surface of the semiconductor chip; and
a connecting terminal connected to the UBM,
wherein the UBM comprises a first section having an upper surface directly contacting the post and a second section having an upper surface directly contacting the insulating layer.

13. The semiconductor package according to claim 12, wherein a lateral edge of the upper surface of the first section vertically overlaps with the post.

14. The semiconductor package according to claim 12, wherein:
the post has an outer surface; and
a maximum width of the outer surface is greater a the maximum width of the upper surface of the first section.

15. The semiconductor package according to claim 14, wherein:
the maximum width of the outer surface is in a range of about 1.2 times or more the maximum width of the upper surface of the first section.

16. A semiconductor package comprising:
a semiconductor chip;
a lower redistribution layer on a lower surface of the semiconductor chip, the lower redistribution layer comprising an insulating layer, a redistribution pattern on the insulating layer, a via connected to an upper surface of the redistribution pattern and extending through the insulating layer in a vertical direction, an under bump metal (UBM) disposed on a lower surface of the redistribution pattern, and a post connected to the redistribution pattern, the post vertically overlaps with the UBM;
a mold layer on the lower redistribution layer, the mold layer surrounding a lateral side surface of the semiconductor chip; and
a connecting terminal connected to the UBM,
wherein the UBM comprises a first section having an upper surface directly contacting the redistribution pattern, and a second section having an upper surface directly contacting the insulating layer, and
wherein the post has a ring shape having an inner surface and an outer surface when viewed in a top view.

17. The semiconductor package according to claim 16, wherein:
the post disposed on an upper surface of the redistribution pattern; and
wherein a portion of the insulating layer is disposed inside the post.

18. The semiconductor package according to claim 17, wherein:
when viewed in the top view, a maximum width of the inner surface is in a range of about 0.2 to about 0.8 times a maximum width of an upper surface of the first section.

19. The semiconductor package according to claim 16, wherein:
the post disposed between the redistribution pattern and the UBM, and the portion of the insulating layer disposed inside the post directly contacts the lower surface of the redistribution pattern and an upper surface of the first section.

20. The semiconductor package according to claim 19, wherein:
   the first section is convex in a direction towards the portion of the insulating layer disposed inside the post; and
   a minimum vertical distance between the redistribution pattern and the UBM is less than a height of the post.

* * * * *